US007102410B2

(12) United States Patent
Khan et al.

(10) Patent No.: US 7,102,410 B2
(45) Date of Patent: Sep. 5, 2006

(54) HIGH VOLTAGE LEVEL CONVERTER USING LOW VOLTAGE DEVICES

(75) Inventors: Qadeer A. Khan, New Delhi (IN); Divya Tripathi, Bhopal (IN); Kulbhushan Misri, Haryana (IN)

(73) Assignee: Freescale Semiconductor, Inc., Austin, TX (US)

( * ) Notice: Subject to any disclaimer, the term of this patent is extended or adjusted under 35 U.S.C. 154(b) by 35 days.

(21) Appl. No.: 10/865,363

(22) Filed: Jun. 10, 2004

(65) Prior Publication Data

US 2005/0275444 A1     Dec. 15, 2005

(51) Int. Cl.
*H03L 5/00* (2006.01)
(52) U.S. Cl. .................. 327/333; 327/306; 327/315
(58) Field of Classification Search ............ None
See application file for complete search history.

(56) References Cited

U.S. PATENT DOCUMENTS

| | | | | |
|---|---|---|---|---|
| 4,150,308 A | | 4/1979 | Adlhoch ................... 326/68 |
| 4,695,744 A | * | 9/1987 | Giordano .................. 327/333 |
| 5,559,464 A | * | 9/1996 | Orii et al. .................. 327/333 |
| 5,698,993 A | * | 12/1997 | Chow ........................ 326/81 |
| 5,781,026 A | * | 7/1998 | Chow ........................ 326/26 |
| 5,818,257 A | * | 10/1998 | Villa ........................... 326/81 |
| 6,603,175 B1 | * | 8/2003 | Kadowaki et al. ......... 257/347 |
| 6,614,283 B1 | | 9/2003 | Wright et al. .............. 327/333 |
| 6,642,769 B1 | | 11/2003 | Chang et al. .............. 327/333 |
| 6,744,676 B1 | * | 6/2004 | Leung et al. .......... 365/189.09 |
| 6,859,917 B1 | * | 2/2005 | Shimazaki et al. .......... 716/17 |
| 2003/0001655 A1 | | 1/2003 | Jeong ........................ 327/333 |
| 2003/0098711 A1 | | 5/2003 | Tsuboi et al. ............... 326/81 |
| 2003/0117207 A1 | | 6/2003 | Suk et al. .................. 327/333 |
| 2003/0189443 A1 | | 10/2003 | Kunz et al. ................. 326/81 |

* cited by examiner

*Primary Examiner*—Tuan T. Lam
*Assistant Examiner*—Hiep Nguyen
(74) *Attorney, Agent, or Firm*—Charles Bergere

(57) ABSTRACT

A circuit for converting an input signal at a first voltage level to an output signal at a second voltage level uses only thin oxide transistors. The circuit includes a first unit operating at a first power supply voltage and receiving the input signal, a second unit operating at a second power supply voltage, and a third unit coupling the first unit to the second unit. The third unit enables generation of the output signal. Use of an extra fabrication mask for thick oxide transistors is avoided by using only thin oxide transistors.

10 Claims, 3 Drawing Sheets

HIGH VOLTAGE LEVEL CONVERTER USING LOW VOLTAGE DEVICES

BACKGROUND OF THE INVENTION

The present invention relates generally to integrated circuits, and more particularly to voltage level converting circuits for shifting digital signals between two different voltage levels.

With recent technological developments, integrated circuits (IC) with very low operating voltages are being used more often. In a circuit that has two ICs operating at different internal operating voltages, a voltage level converter is used to facilitate the transfer of signals between the two ICs. For example, if the first IC, operating at 1.2V, is used in conjunction with the second IC, operating at 2.5V, a voltage level converter is incorporated in the second IC. The voltage level converter translates the output signal of the first IC from the operating voltage level of 1.2V to an input voltage of 2.5V for the second IC.

Voltage level converter circuits are typically made using a plurality of Metal-Oxide-Semiconductor Field Effect Transistors (MOSFET). A MOSFET is characterized by the thickness of its gate oxide layer. The thickness of the gate size affects the switching speed and voltage range over which the transistor can operate. By reducing the thickness of the gate oxide layer, it is possible to increase the switching speed of the transistor.

The thickness of the gate oxide affects the voltage range over which the transistor is operable because a transistor can operate only if the voltage across its gate and its source is greater than a threshold voltage. The threshold voltage depends on the gate size. Hence, it is essential that the gate size be suitably selected. This gate size selection is of particular importance in the case of a voltage level converter. For example, the voltage level converter receives an input signal at the first voltage level and generates an output signal at the second voltage level. Hence, the gate size of each of the transistors should be selected so that each transistor can operate appropriately.

Conventional voltage level converters use transistors having a thick layer of oxide. These transistors are referred to as thick oxide transistors. Some voltage level converters use a combination of thick and thin oxide transistors.

Thick oxide transistors cannot withstand very low operating voltages. For example, thick oxide transistors have a threshold voltage of around 0.7V and an operating voltage of around 1V. Since the operating and threshold voltages are close, the reliability and performance of the voltage level converter is adversely affected. Consequently, voltage level converters with thick oxide transistors are not efficient or reliable at low voltages and limit the frequency of operation as well. Also, manufacturing thick oxide transistors requires extra masks and hence, more steps are required in the fabrication process, which leads to an increase in the cost of manufacture.

Therefore, there is a need for cost effective voltage level converters that can operate reliably with ICs, which have low operating voltages.

BRIEF DESCRIPTION OF THE DRAWINGS

The following detailed description of the preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

For the sake of convenience, the terms that have been used to describe the various embodiments are defined below. It is to be noted that these definitions are provided merely to aid the understanding of the description, and are in no way to be construed as limiting the scope of the invention.

The term "voltage level" refers to the voltage corresponding to the logic values of a signal. For example, a signal at logic low may have a voltage of about 0.0V, while a signal at logic high may have a voltage of about 1.2V.

The present invention provides a voltage level converting circuit to convert an input signal at a first voltage level to an output signal at a second voltage level. The circuit includes a first unit operating at a first power supply voltage, and receiving the input signal, a second unit operating at a second power supply voltage, and a third unit coupling the first unit to the second unit and enabling the generation of the output signal. Each of the three units consists essentially of thin oxide NMOS and PMOS transistors.

In an embodiment of the present invention, the first unit comprises a first NMOS transistor, a second NMOS transistor, and an inverter. The second unit comprises first and second PMOS transistors, and the third unit comprises third and fourth NMOS transistors, and third and fourth PMOS transistors.

In accordance with another embodiment of the present invention, the third unit further comprises fifth and sixth PMOS transistors, and the first unit further comprises seventh and eighth PMOS transistors.

Figure 1:
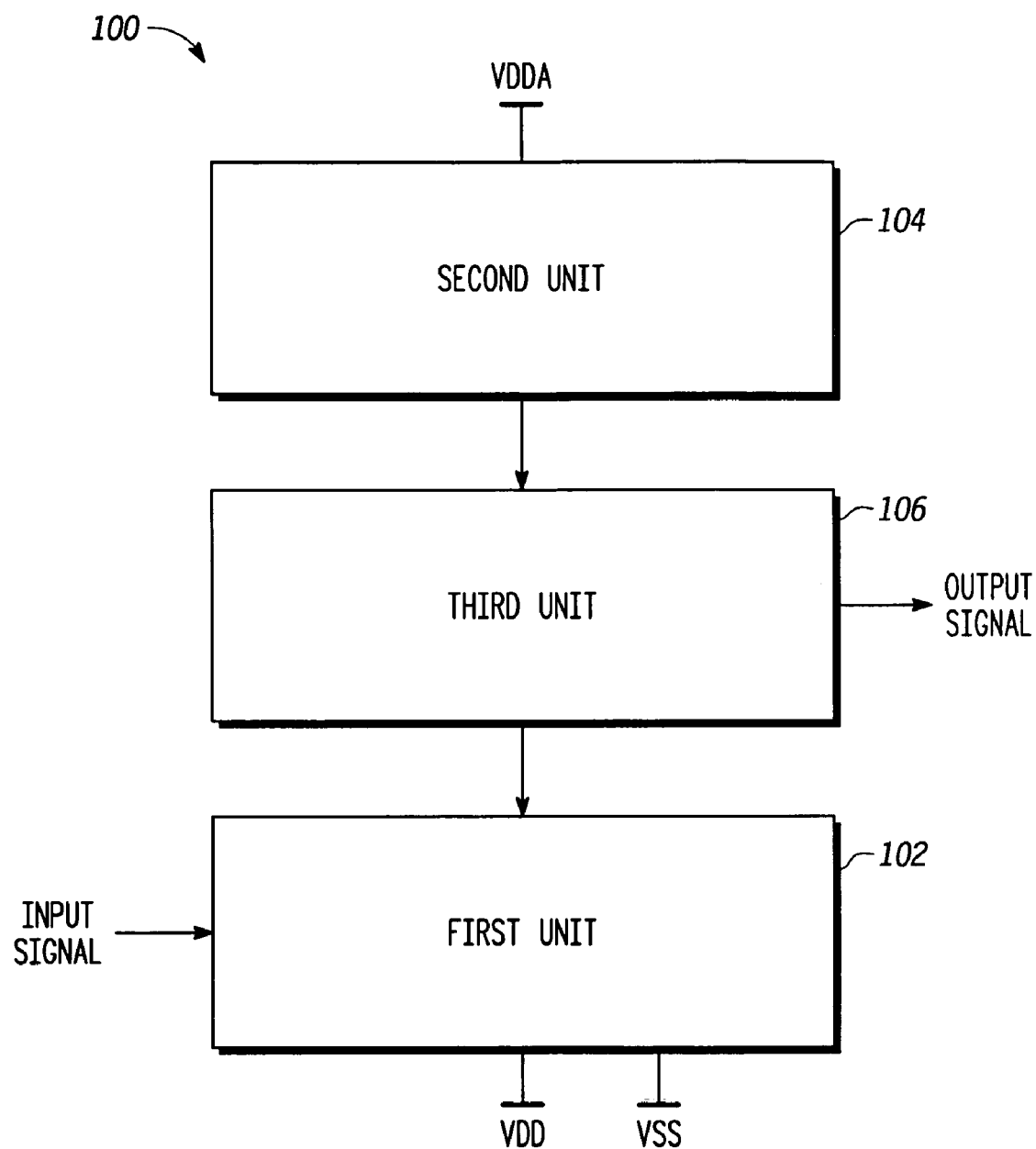
FIG. 1 is a schematic block diagram illustrating a voltage level converting circuit according to an embodiment of the present invention.

Referring now to FIG. 1, a schematic block diagram illustrating a voltage level converting circuit 100 according to an embodiment of the present invention is shown. The voltage level converting circuit 100 comprises a first unit 102, a second unit 104, and a third unit 106. Both the first unit 102 and the second unit 104 are coupled to the third unit 106. An input signal at a first voltage level is provided to the first unit 102. The first unit 102 operates at a first power supply voltage, hereinafter referred to as VDD. The third unit 106 generates an output signal and a complement of the output signal at a second voltage level. The second unit 104 operates at a second power supply voltage, hereinafter referred to as VDDA.

In an embodiment of the invention, the input signal at the first voltage level has a voltage at or near VDD if the input signal is logic high. If the input signal is logic low, the voltage of the input signal is a reference voltage, hereinafter referred to as VSS. According to an embodiment of the present invention, VSS is at or near the ground voltage (0V). The output signal at the second voltage level is at or near VDDA, if the output signal is logic high. When the output signal is logic low, the voltage of the output signal is at or near VSS.

Each of the first, second and third units 102, 104 and 106 is formed using thin oxide transistors. Circuit diagrams illustrating two exemplary embodiments of the voltage level converting circuit 100 are hereinafter described in conjunction with FIGS. 2 and 3.

Figure 2:
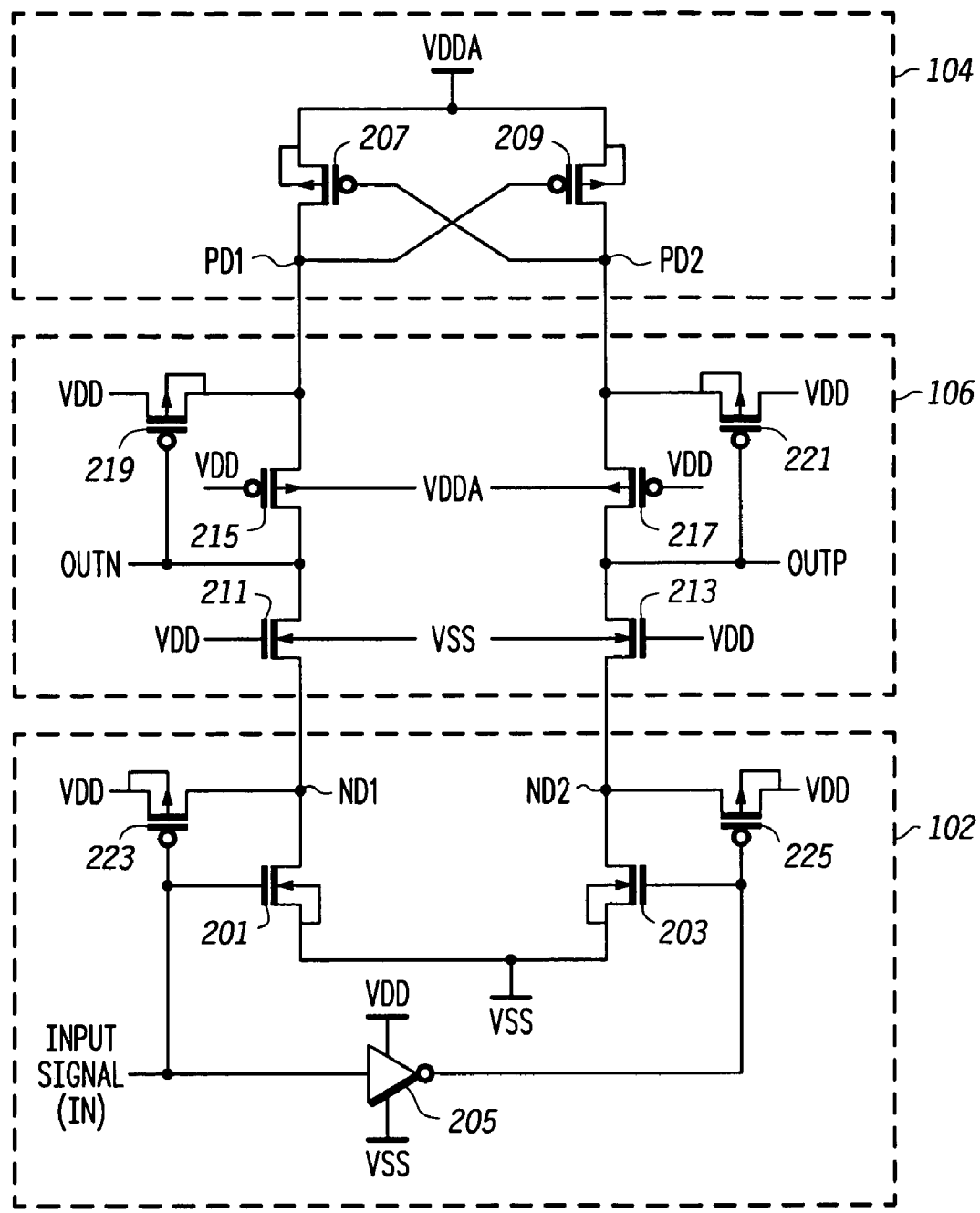
FIG. 2 is a schematic circuit diagram of a voltage level converting circuit according to an embodiment of the present invention.

FIG. 2 is a schematic circuit diagram of one embodiment of the voltage level converting circuit 100 of the present invention. The first unit 102 comprises a first NMOS transistor 201, a second NMOS transistor 203, and an inverter 205. The second unit 104 comprises a first PMOS transistor 207 and a second PMOS transistor 209. The third unit 106 comprises a third NMOS transistor 211, a fourth NMOS transistor 213, a third PMOS transistor 215, and a fourth PMOS transistor 217. The third unit 106 couples the first unit 102 to the second unit 104.

In accordance with an embodiment of the present invention, the third unit 106 further comprises a fifth PMOS transistor 219 and a sixth PMOS transistor 221. The first unit 102 further comprises a seventh PMOS transistor 223 and an eighth PMOS transistor 225.

The gate of the first NMOS transistor 201 is connected to the input signal. The drain of the first NMOS transistor 201 is connected to the source of third NMOS transistor 211 and the drain of seventh PMOS transistor 223 at a node ND1. The sources of the first and second NMOS transistors 201 and 203 are connected to the first reference voltage VSS. The bulks of the first and second NMOS transistors 201 and 203 are connected to their respective sources. The inverter 205 inverts the input signal and supplies the inverted input signal to the gates of the second NMOS transistor 203 and the eighth PMOS transistor 225. The drain of the second NMOS transistor 203 is connected to the source of the fourth NMOS transistor 213, and the drain of the eighth PMOS transistor 225 at a node ND2. The bulks of the seventh and eighth PMOS transistors 223 and 225 are connected to their respective sources, and the sources of the seventh and eighth PMOS transistors 223 and 225 are connected to VDD. The gate of the seventh PMOS transistor 223 is connected to the input signal.

The sources of the first PMOS transistor 207 and the second PMOS transistor 209 are connected to VDDA. The drain of the first PMOS transistor 207 is connected to the gate of the second PMOS transistor 209. The drain of the second PMOS transistor 209 is connected to the gate of the first PMOS transistor 207. The bulks of the first and second PMOS transistors 207 and 209 are connected to their respective sources.

The gates of third and fourth NMOS transistors 211 and 213, and the third and fourth PMOS transistors 215 and 217, are all connected to VDD. The drains of the third NMOS transistor 211 and the third PMOS transistor 215 are connected at an output node OUTN. The voltage at the node OUTN is the inverted output signal for the voltage level converting circuit 100. The drain of the third NMOS transistor 211 is also connected to the gate of the fifth PMOS transistor 219.

The drains of the fourth NMOS transistor 213 and the fourth PMOS transistor 217 are connected at an output node OUTP. The voltage at the node OUTP is the output signal for the voltage level converting circuit 100. The drain of the fourth NMOS transistor 213 is also connected to the gate of the sixth PMOS transistor 221. The source of the third PMOS transistor 215 is connected to the drain of the fifth PMOS transistor 219, and the drain of the first PMOS transistor 207 at a node PD1. The source of the fourth PMOS transistor 217 is connected to the drain of the sixth PMOS transistor 221, and the drain of the second PMOS transistor 209 at a node PD2.

The sources of the fifth and sixth PMOS transistors 219 and 221 are connected to VDD. The bulk of the fifth PMOS transistor 219 is connected to its drain. Similarly, the bulk of the sixth PMOS transistor 221 is connected to its own drain. The bulks of the third and fourth NMOS transistors 211 and 213 are connected to VSS. The bulks of the third and fourth PMOS transistors 215 and 217 are connected to VDDA.

The operation of the above-described circuit is hereinafter explained. For the purpose of explanation, VDD is assumed to be 1.2V and VDDA is assumed to 2.5V. Accordingly, the drain-to-source voltage VDS, gate-to-source voltage VGS and gate-to-bulk voltage VGB of a thin oxide transistor should not exceed the voltage range of 1.8–2V, in order to ensure the reliability of the device.

When the input signal increases from VSS to VDD, the first NMOS transistor 201 is turned ON and the voltage at the node ND1 becomes equal to VSS. Since, the gate of the third NMOS transistor 211 is connected to VDD, the third NMOS transistor 211 is in an ON state, which causes the voltage at the node OUTN to fall to VSS, thereby turning ON the fifth PMOS transistor 219. Consequently, the node PD1 discharges through the fifth PMOS transistor 219 to VDD. When the difference in voltage levels at the node PD1 and the gate of the third PMOS transistor 215 becomes less than the threshold voltage of the third PMOS transistor 215, the third PMOS transistor 215 is turned OFF. Hence, the node PD1 is isolated from the node OUTN, which prevents the node PD1 from discharging to VSS. This isolation prevents the drain-to-source voltage, VDS, of the first PMOS transistor 207 and the gate-to-source voltage, VGS, of the second PMOS transistor 209 from exceeding the voltage difference VDDA-VDD. Consequently, the VDS of the first PMOS transistor 207 and the VGS of the second PMOS transistor 209 remain less than 2.5−1.2=1.3 Volts.

The inverter 205 inverts the input signal, which is at VDD, and supplies it to the gates of the second NMOS transistor 203 and the eighth PMOS transistor 225. As a result, the second NMOS transistor 203 is turned OFF and the eighth PMOS transistor 225 is turned ON. Also, the voltage at the node ND2 equals VDD. Since, the node PD1 is discharged to VDD, the second PMOS transistor 209 is turned ON and the voltage at the node PD2 equals VDDA. The fourth PMOS transistor 217 is turned ON, which in turn causes the node OUTP to charge to VDDA, thereby generating the output voltage. As a result, the sixth PMOS transistor 221 is turned OFF, thus preventing any current flowing from VDDA to VDD through the second PMOS transistor 209 and the sixth PMOS transistor 221. At the same time, the node ND2 begins to gradually charge to VDDA through the fourth NMOS transistor 213. However, as soon as the voltage at the node ND2 equals the voltage difference between VDD and the threshold voltage of the fourth NMOS transistor 213, the fourth NMOS transistor 213 is turned OFF. This stops the charging of the node ND2. Since the voltage at the node ND2 is VDD, the VDS of the fourth NMOS transistor 213 remains at the voltage difference VDDA-VDD. The VDS of the second NMOS transistor 203 remains at VDD. Hence, both of the second NMOS transistor 203 and the fourth NMOS transistor 213 are protected against exceeding the device maximum voltage rating.

The VGB of the fifth PMOS transistor 219 and the sixth PMOS transistor 221 do not exceed the voltage difference VDDA-VDD because due to the connection of the bulks of the fifth PMOS transistor 219 and the sixth PMOS transistor 221 to the nodes PD1 and PD2, respectively. When the voltage at the node OUTN is VSS, the voltage at the node PD1 is VDD. Thus, the VGB of the fifth PMOS transistor 219 remains at VDD. When the voltage at the node OUTP is VDDA, the bulk of the sixth PMOS transistor 221 also remains at VDDA. Similarly, if the input signal is at VSS, the voltage obtained at the node OUTP is also VSS, and the voltage obtained at the node OUTN is VDDA.

The level converting circuit 100 could be modified such that the bulks of the third and fourth PMOS transistors 215 and 217 are connected to their respective sources, and the bulks of the third and fourth NMOS transistors 211 and 213 are connected to their respective sources, which avoids an increase in the threshold voltage of the transistors due to the body effect and hence, the circuit can operate at a higher frequency.

Figure 3:
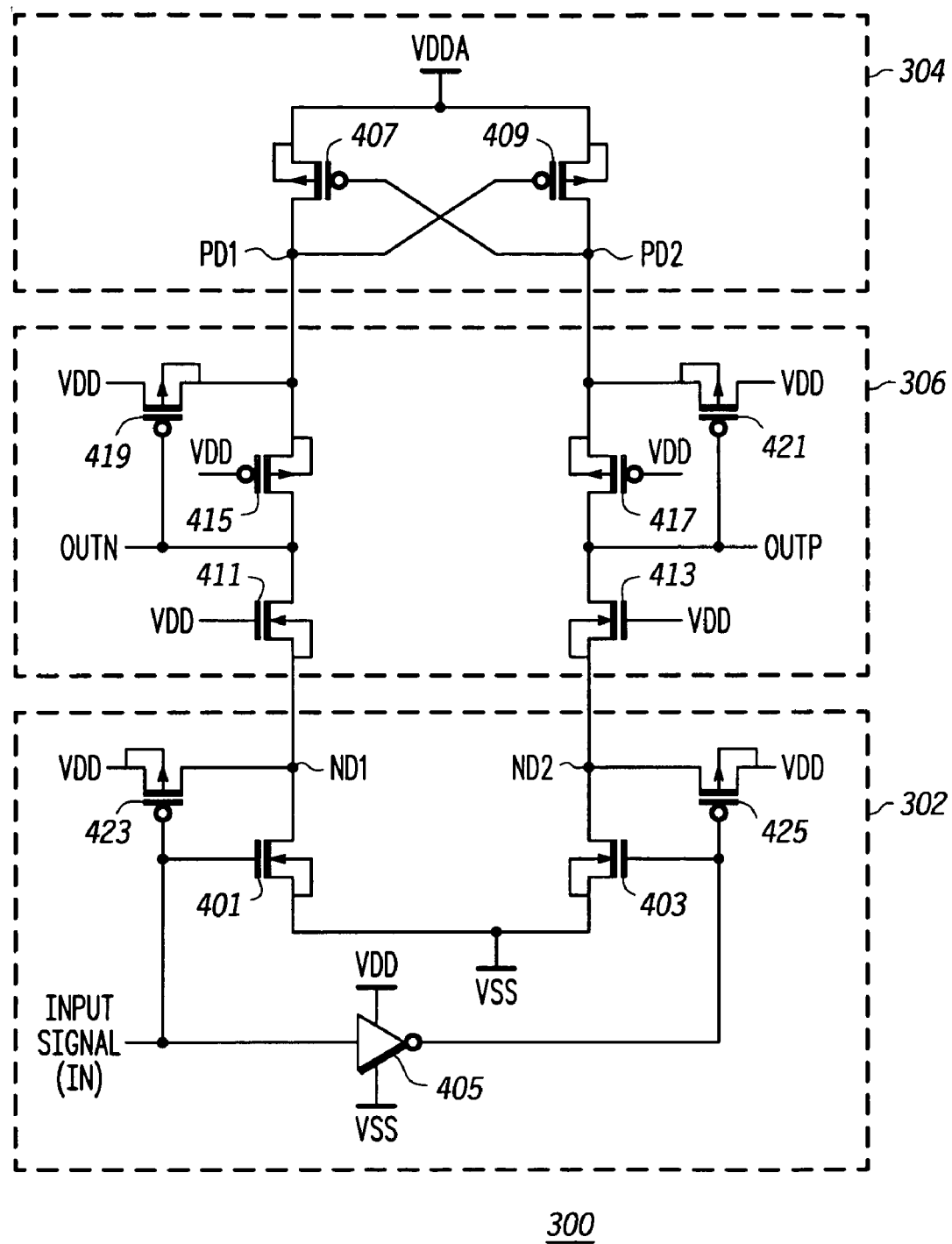
FIG. 3 is a schematic circuit diagram of a voltage level converting circuit according to another embodiment of the present invention.

FIG. 3 is a schematic circuit diagram of a voltage level converting circuit 300 according to another embodiment of the present invention. The voltage level converting circuit 300 includes a first unit 302, a second unit 304, and a third unit 306. The first unit 302 includes a first NMOS transistor 401, a second NMOS transistor 403, and an inverter 405. The first and second NMOS transistors 401 and 403 and the inverter 405 are connected in the same manner as the first and second NMOS transistors 201 and 203 and the inverter 205 of the first unit 102 (FIG. 2).

The second unit 304 includes first and second PMOS transistors 407 and 409 connected in the same manner as the first and second PMOS transistors 207 and 209 shown in FIG. 2. As can be seen, the second unit 304 is essentially the same as the second unit 104 (FIG. 2).

The third unit 306 includes third and fourth NMOS transistors 411 and 413, third and fourth PMOS transistors 415 and 417, and fifth and sixth PMOS transistors 419 and 421. The third unit 306 is similar to the third unit 106 of the level converter circuit 100 except that the bulks of the third and fourth NMOS transistors 411 and 413 are connected to their respective sources, and the bulks of the third and fourth PMOS transistors 415 and 417 have their bulks connected to their respective sources. The first unit 302 further includes seventh and eighth PMOS transistors 423 and 425, which are akin to seventh and eighth PMOS transistors 223 and 225 of the first unit 102 shown in FIG. 2.

The operation of the voltage level converting circuit 300 illustrated in FIG. 3 is similar to that of the voltage level converting circuit 100 illustrated in FIG. 2.

The level converting circuit of the present invention has an advantage over prior art circuits in that it can be operated at lower input voltage levels without affecting the reliability of the output signals generated because the circuit of the present invention uses only thin oxide transistors, which can withstand lower operating voltages than circuits with thick oxide transistors. Additionally, the use of thin oxide transistors reduces the number of masks required during fabrication of the voltage level converting circuit. Consequently, the cost of manufacturing the circuit is considerably reduced. The use of thin oxide transistors also allows the circuit to operate at a higher frequency.

While the various embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A circuit for converting an input signal at a first voltage level to an output signal at a second voltage level, the circuit comprising:
    a first unit operating at a first power supply voltage, the first unit receiving the input signal, wherein the first unit includes,
    a first NMOS transistor having a gate connected to the input signal, a source connected to a reference voltage, and a drain;
    a second NMOS transistor having a source connected to the reference voltage and a drain; and
    an inverter having an input connected to the input signal and an output connected to a gate of the second NMOS transistor;
    a second unit operating at a second power supply voltage, wherein the second unit includes,
    a first PMOS transistor having a source connected to the second power supply voltage; and
    a second PMOS transistor having a gate connected to a drain of the first PMOS transistor, a drain connected to a gate of the first PMOS transistor and a source connected to the second power supply voltage; and
    a third unit coupling the first unit to the second unit, the third unit enabling generation of the output signal, wherein the third unit includes,
    a third NMOS transistor having a source connected to the first unit and a gate connected to the first power supply voltage;
    a fourth NMOS transistor having a source connected to the first unit and a gate connected to the first power supply voltage;
    a third PMOS transistor having a gate connected to the first power supply voltage, a source connected to the second unit and a drain connected to a drain of the third NMOS transistor;
    a fourth PMOS transistor having a gate connected to the first power supply voltage, a source connected to the second unit and a drain connected to a drain of the fourth NMOS transistor, wherein the output signal is generated at the drains of the third and fourth NMOS transistors;
    a fifth PMOS transistor having a source connected to the first power supply voltage, a drain connected to the source of the third PMOS transistor, a bulk connected to its drain, and a gate connected to the drain of the third NMOS transistor; and
    a sixth PMOS transistor having a source connected to the first power supply voltage, a drain connected to the source of the fourth PMOS transistor, a bulk connected to its drain, and a gate connected to the drain of the fourth NMOS transistor; and
    wherein each of the first, second and third units consists essentially of thin oxide transistors.

2. The voltage level converting circuit of claim 1, wherein a bulk of the third PMOS transistor is connected to the second power supply voltage, a bulk of the fourth PMOS transistor is connected to the second power supply, a bulk of the third NMOS transistor is connected to the reference voltage, and a bulk of the fourth NMOS transistor is connected to the reference voltage.

3. The voltage level converting circuit of claim 1, wherein a bulk of the third PMOS transistor is connected to its source, a bulk of the fourth PMOS transistor is connected to its source, a bulk of the third NMOS transistor is connected to its source, and a bulk of the fourth NMOS transistor is connected to its source.

4. The voltage level converting circuit of claim 1, wherein the first unit further comprises:
- a seventh PMOS transistor having a gate connected to the gate of the first NMOS transistor, a source connected to the first power supply voltage, and a drain connected to the drain of the first NMOS transistor; and
- an eighth PMOS transistors having a gate connected to a gate of the second NMOS transistor, a source connected to the first power supply voltage, and a drain connected to a drain of the second NMOS transistor.

5. The voltage level converting circuit of claim 1, herein the inverter is connected to the first power supply voltage and the reference voltage.

6. A circuit for converting an input signal at a first voltage level to an output signal at a second voltage level, the circuit comprising:
- a first unit operating at a first power supply voltage, the first unit comprising:
  - a first NMOS transistor having a gate connected to the input signal, a source connected to a reference voltage, and a drain;
  - a second NMOS transistor having a source connected to the reference voltage and a drain; and
  - an inverter having an input connected to the input signal and the gate of the first NMOS transistor, and an output connected to a gate of the second NMOS transistor;
- a second unit operating at a second power supply voltage, the second unit comprising:
  - a first PMOS transistor having a source connected to the second power supply voltage; and
  - a second PMOS transistor having a gate connected to a drain of the first PMOS transistor, a drain connected to a gate of the first PMOS transistor and a source connected to the second power supply voltage; and
- a third unit coupling the first unit to the second unit, the third unit comprising:
  - a third NMOS transistor having a source connected to the drain of the first NMOS transistor and a gate connected to the first power supply voltage;
  - a fourth NMOS transistor having a source connected to the drain of the second NMOS transistor and a gate connected to the first power supply voltage;
  - a third PMOS transistor having a gate connected to the first power supply voltage, a source connected to the drain of the first PMOS transistor and a drain connected to a drain of the third NMOS transistor; and
  - a fourth PMOS transistor having a gate connected to the first power supply voltage, a source connected to the drain of the second PMOS transistor, and a drain connected to a drain of the fourth NMOS transistor, wherein the output signal is generated at the drain of the fourth NMOS transistor;
  - a fifth PMOS transistor having a source connected to the first power supply voltage, a drain connected to the source of the third PMOS transistor, a bulk connected to its drain, and a gate connected to the drain of the third PMOS transistor; and
  - a sixth PMOS transistor having a source connected to the first power supply voltage, a drain connected to the source of the fourth PMOS transistor, a bulk connected to its drain, and a gate connected to the output signal; and
- wherein each of the first, second and third units consists essentially of thin oxide transistors.

7. The voltage level converting circuit of claim 6, wherein a bulk of the third PMOS transistor is connected to the second power supply voltage, a bulk of the fourth PMOS transistor is connected to the second power supply, a bulk of the third NMOS transistor is connected to the reference voltage, and a bulk of the fourth NMOS transistor is connected to the reference voltage.

8. The voltage level converting circuit of claim 6, wherein a bulk of the third PMOS transistor is connected to its source, a bulk of the fourth PMOS transistor is connected to its source, a bulk of the third NMOS transistor is connected to its source, and a bulk of the fourth NMOS transistor is connected to its source.

9. The voltage level converting circuit of claim 6, wherein the first unit further comprises:
- a seventh PMOS transistor having a gate connected to the gate of the first NMOS transistor, a source connected to the first power supply voltage, and a drain connected to the drain of the first NMOS transistor; and
- an eighth PMOS transistors having a gate connected to a gate of the second NMOS transistor, a source connected to the first power supply voltage, and a drain connected to a drain of the second NMOS transistor.

10. The voltage level converting circuit of claim 6, wherein the inverter is connected to the first power supply voltage and the reference voltage.

* * * * *